United States Patent [19]
Rasor

[11] Patent Number: 5,222,079
[45] Date of Patent: Jun. 22, 1993

[54] ADAPTIVE INFORMATION SIGNAL RECEIVER

[75] Inventor: Gregg E. Rasor, Boynton Beach, Fla.

[73] Assignee: Motorola, Inc., Schaumburg, Ill.

[21] Appl. No.: 604,045

[22] Filed: Oct. 25, 1990

[51] Int. Cl.$^5$ ............................................. H04L 27/06
[52] U.S. Cl. ........................................ 375/97; 375/76; 375/88; 329/300; 455/260
[58] Field of Search ..................... 375/81, 88, 91, 97, 375/76; 329/300, 302, 303, 325, 326; 455/257, 258, 259, 260, 265, 184.1

[56] References Cited

U.S. PATENT DOCUMENTS

| | | | |
|---|---|---|---|
| 4,234,852 | 11/1980 | McCorkle | 375/91 |
| 4,523,324 | 6/1985 | Marshall | 375/97 |
| 4,575,863 | 3/1986 | Butcher et al. | 375/76 |
| 4,672,636 | 6/1987 | Marshall et al. | 375/97 |
| 4,947,409 | 8/1990 | Raith et al. | 375/97 |
| 5,053,717 | 10/1991 | Schulz et al. | 375/76 |

*Primary Examiner*—Curtis Kuntz
*Assistant Examiner*—Young Tse
*Attorney, Agent, or Firm*—Jose Gutman; William E. Koch; Thomas G. Berry

[57] ABSTRACT

A communication receiver includes a mixer (306) for converting a received signal to a first signal and a detector (320) for recovering an information signal from the first signal such that the information signal has at least two states representing at least two spectral positions of the first signal. A memory (324) stores at least one control configuration for the mixer (306). A controller (210) coupled to the memory (324) controls the mixer (306) and is responsive to the at least two information signal states being within an operating range of the detector (320). The controller (210) adjusts the at least two spectral positions of the first signal while maintaining the at least two spectral positions of the first signal within an operating region of the detector (320).

14 Claims, 6 Drawing Sheets

ADAPTIVE INFORMATION SIGNAL RECEIVER

FIELD OF THE INVENTION

This invention relates in general to the field of communication receivers, and more specifically to those communication receivers capable of adaptively receiving an information signal.

BACKGROUND OF THE INVENTION

A conventional communication receiver (e.g., a selective call receiver or pager) normally receives and decodes a transmitted signal in a known way. The contemporary receiver typically receives a modulated carrier signal and converts the carrier signal to an intermediate frequency signal using at least one mixing signal that may be provided from a fixed local oscillator. Subsequently, a demodulating stage substantially recovers an information signal. The recovered information signal may be provided to a decoder to extract encoded data information (e.g., pager address and other control information, as well as optional message data), and/or may be provided to an audio circuit to present an audible alert or other audible signal to a user of the communication receiver.

The recovered information signal typically may include noise and distortion due to a number of sources. One particularly regrettable source of distortion may result from the unmodulated carrier signal being relatively unsynchronized with the at least one mixing signal. Due to variability of a transmitted carrier signal relative to a specified tolerance range at the receiver, further aggravated by variability of the at least one mixing signal from the fixed local oscillator, the receiver demodulating circuits may provide a substantially distorted recovered signal.

Moreover, in conventional communication systems the user of the receiver may roam from one transmitter signal to another (e.g., in simulcast paging systems), therefore providing diverse carrier signals to the receiver (i.e., usually within a specified acceptable operating range). Consequently, the received modulated carrier signal mixes with the at least one mixing signal and demodulates to a recovered information signal that may be substantially distorted.

The unfortunate distortion may be due to the recovered information signal dynamic range being substantially skewed with respect to an acceptable operating range for the demodulating circuits. That is, the recovered information signal excursions may traverse beyond an acceptable operating range for the demodulating circuits. Typically, an acceptable operating range may comprise a linear operating region, and beyond the acceptable operating range may comprise a nonlinear operating region. Therefore, the recovered information signal may regrettably include less than optimum excursions (i.e., distortion).

Additionally, a signal-to-noise ratio (S/N) for the receiver may be seriously degraded by the reduced effective dynamic range of the recovered signal. Since the recovered signal excursions may be substantially limited at an operating range boundary, the overall recovered signal dynamic range is reduced, and consequently the signal-to-noise ratio for the recovered signal is degraded. Therefore, the unfortunate lack of synchronization between a transmitted carrier signal and the at least one mixing signal at the receiver may detrimentally affect the signal-to-noise ratio for the receiver.

Further, the subsequent decoding of a recovered data signal may be potentially "falsed" by noise signals, possibly missing a critical transmitted communication (e.g., a system control information, or a vital message for the user of the receiver).

Therefore, it is regrettable that no known communication receiver is capable of monitoring the recovered signal excursions and adaptively maintaining the recovered signal excursions to within an acceptable operating range by substantially resynchronizing the at least one mixing signal to the varying transmitted carrier signal.

SUMMARY OF THE INVENTION

In carrying out one form of this invention, there is provided a communication receiver, comprising means for converting a received signal to a first signal, and means for recovering an information signal from the first signal such that the information signal has at least two states representing at least two spectral positions of the first signal. The communication receiver also comprises memory means for storing at least one control configuration for the converting means. A means coupled to the memory means for controlling the converting means, in response to the at least two information signal states being within an operating range of the recovering means, thereby adjusts the at least two spectral positions of the first signal while maintaining the at least two spectral positions of the first signal within an operating region of the recovering means.

DESCRIPTION OF A PREFERRED EMBODIMENT

Figure 1:
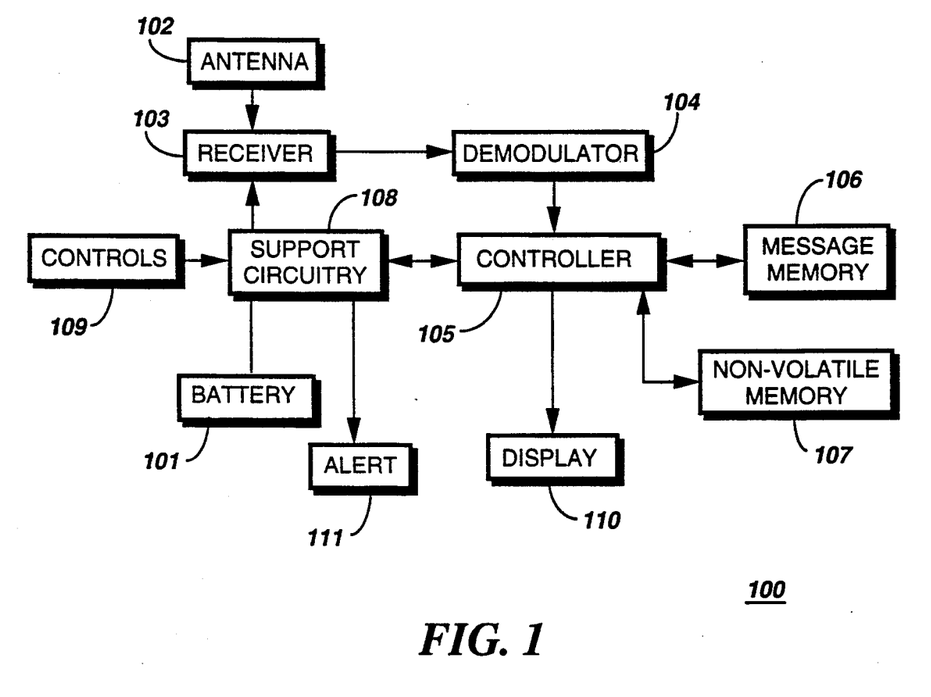
FIG. 1 is a block diagram of a conventional communication receiver (e.g., a selective call receiver).

Referring to FIG. 1, a battery 101 powered information display selective call receiver 100 operates to receive a signal via an antenna 102. A receiver 103 couples the received signal to a demodulator 104, which recovers any information signal present using conventional techniques. The recovered information signal is coupled to a controller 105 that interprets and decodes the recovered information. In the preferred embodiment, the controller 105 may comprise a microprocessor having a signal processor (decoder) implemented in both hardware and software.

The recovered information signal is checked by the decoder, which implements the signal processor that correlates a recovered address (i.e., a recovered information signal comprising address information) with a predetermined address stored in the selective call receiver's non-volatile memory 107. The non-volatile memory 107 typically includes a plurality of registers for storing a plurality of configuration words that characterize the operation of the selective call receiver 100. In determining the selection of the selective call receiver 100, a correlation is performed between a predetermined address associated with the selective call receiver 100 and a received and recovered address. When the addresses correlate, the controller 105 may couple a received and recovered message information to the message memory 106. In accordance with the recovered information, and settings associated with the user controls 109, the selective call receiver 100 typically presents at least a portion of the message information, such as by a display 110, and signals the user via an audible or tactile alert 111 that a message has been received. The user may view the information presented on the display 110 by activating the appropriate controls 109.

A support circuit 108 preferably comprises a conventional signal multiplexing integrated circuit, a voltage regulator and control mechanism, a current regulator and control mechanism, environmental sensing circuitry such as for light or temperature conditions, audio power amplifier circuitry, control interface circuitry, and display illumination circuitry. These elements are arranged in a known manner to provide the information display receiver 100 as requested by the customer.

Figure 2:
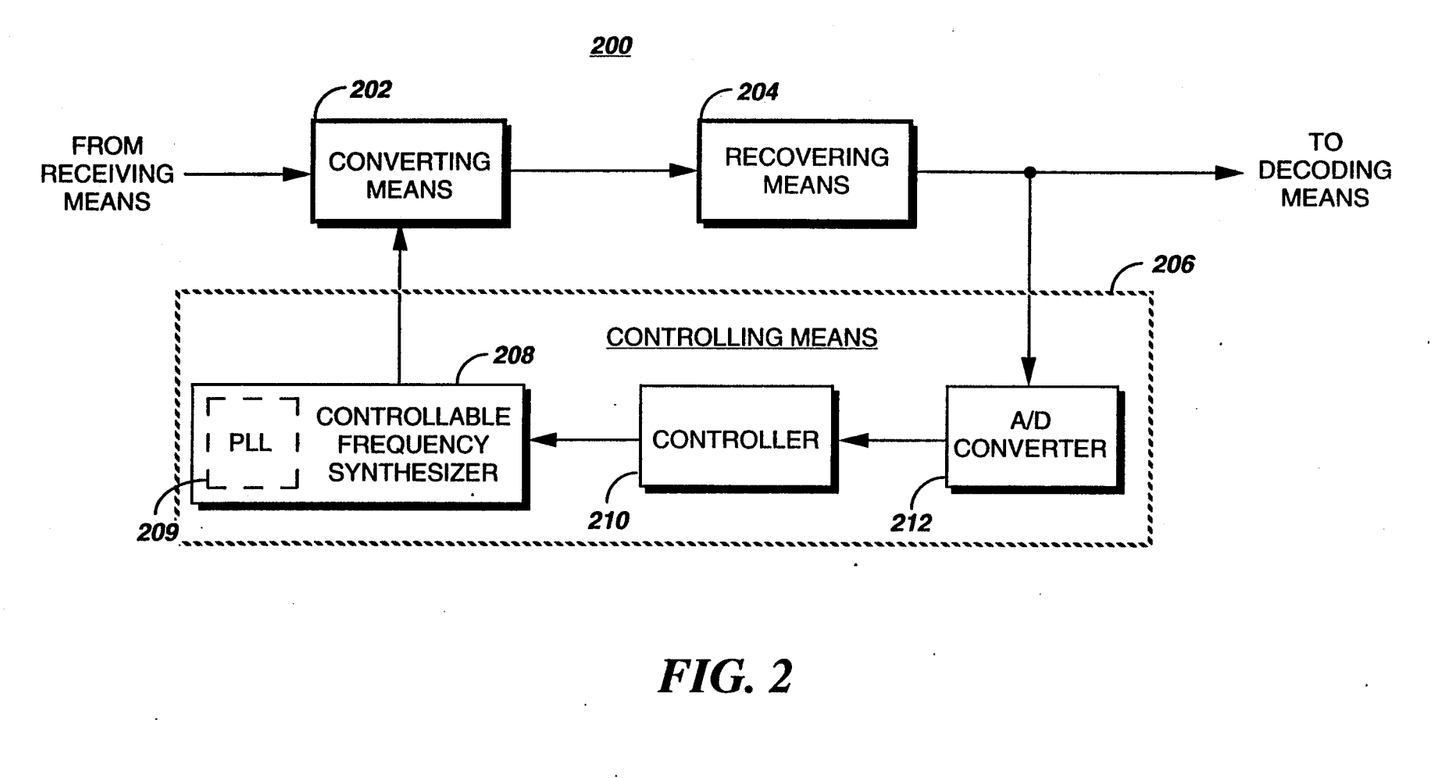
FIG. 2 is a partial block diagram of a communication receiver, illustrating a receiver, demodulator, and controller organization, in accordance with an embodiment of the present invention.

Referring to FIG. 2, a partial block diagram of a selective call receiver 200 illustrates a receiver with a converting means 202, a demodulator (i.e., a recovering means) 204, and a controller 206 arrangement, in accordance with an embodiment of the present invention. A received signal that may include a modulated carrier signal is typically converted down (202) to an intermediate frequency signal using conventional techniques.

The converting means 202 may mix the received signal with at least one control "mixing" signal that may be provided by a controllable frequency synthesizer (i.e., a controllable signal source) 208. In the preferred embodiment, the controllable frequency synthesizer 208 may comprise a programmable phase-locked loop circuitry (PLL) 209, optionally using a fractional N division scheme such that the control "mixing" signal frequency may be stepped in coarse or very fine increments.

The controllable frequency synthesizer 208 may be responsive to a controller module (e.g., an MC68HC05C4 manufactured by Motorola, Inc.) 210, that performs a sequence of decisions and controlling actions, as will subsequently more fully discussed. The controller module 210 may adjust the control "mixing" signal frequency by writing a control word (i.e., a divide factor) into the controllable frequency synthesizer (e.g., programmable phase-locked loop 209) 208, and thereby programming the controllable frequency synthesizer 208 to a target frequency.

An analog-to-digital (A/D) converter module 212 may sample a recovered information signal that is provided by a recovering means 204. The recovered information signal excursions about an operating range are monitored and digitally encoded by the A/D converter 212 such that the digitally encoded representations may be read by the controller module (e.g., the MC68HC05C4) 210.

Therefore, by monitoring the recovered information signal excursions about an operating range the controller module 210 may execute a sequence of decisions and adjust the frequency of a control "mixing" signal that is provided to the converting means 202. In this way, the closed-loop control system depicted in FIG. 2 may adapt to the changing recovered information signal excursions about an operating range and adjust the frequency of the control "mixing" signal to maintain the converted intermediate frequency signal within an operating region of the recovering means 204, as will be more fully discussed below.

Figure 3:
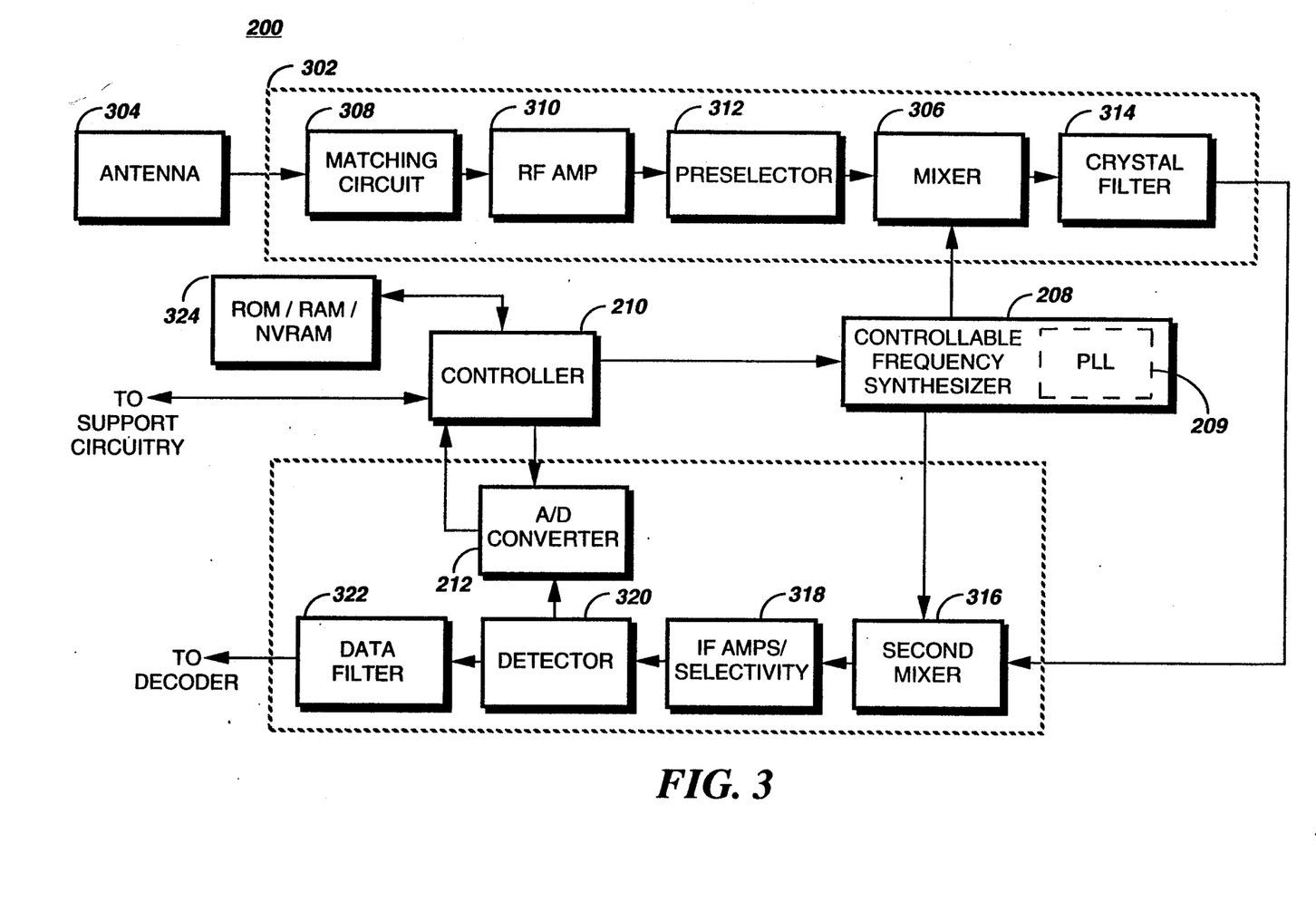
FIG. 3 is a more detailed block diagram of the selective call receiver of FIG. 2.

Referring to FIG. 3, a more detailed block diagram of the selective call receiver 200 of FIG. 2 is shown, in accordance with an embodiment of the present invention. The selective call receiver "RF front end" 302 typically is responsive to a transmitted signal that may be received and coupled in via an antenna 304, as is commonly known in the art. The received signal from the antenna 304 may be optionally preconditioned using known techniques to provide an optimum signal level within a predetermined frequency bandwidth that is coupled to a first signal converter (i.e., a first mixer) 306.

The optional preconditioning of the received signal usually may be performed by a matching circuit 308, a radio frequency amplifier (i.e., an RF amplifying circuit) 310, and a preselector filtering circuit 312, the design and function of these circuits being generally well known in the art. The matching circuit 308 matches the antenna 304 characteristics to the RF amplifying circuit 310, thereby delivering the received signal from the antenna 304 to the RF amplifier 310 with minimum loss of signal power within a predetermined frequency band. The amplified signal may then be coupled to a preselector filtering circuit 312 that typically accepts signal with minimal attenuation within a predetermined frequency band and attenuates (i.e., rejects) signal outside of the predetermined frequency band. Consequently, the received signal may be optionally preconditioned and coupled to the first signal converter (i.e., the first mixer) 306.

The first signal converter 306 may subsequently mix the optionally preconditioned received signal with a first control "mixing" signal that may be provided by the controllable frequency synthesizer (i.e., the controllable signal source) 208. The converted intermediate frequency signal may subsequently be coupled to a crystal filter 314 that is typically designed to pass substantially unattenuated the intermediate frequency signal within a predetermined frequency band and attenuate any signals outside of the predetermined frequency band.

Optionally, a second signal converter (i.e., a second mixer) 316 may mix the intermediate frequency signal with a second control "mixing" signal that may be provided by the controllable frequency synthesizer (i.e., the controllable signal source) 208. The resulting second intermediate signal may again be filtered (i.e., by an intermediate frequency amplifying and filtering circuit 318) and presented to the demodulator (i.e., the detector) 320. The demodulator 320 may consequently recover an information signal (e.g., an information data signal) that may be presented to a decoder (i.e., via a data filter 322) in a manner well known in the art.

Contemporaneously, the A/D converter 212 may sample the recovered information data signal excursions about an operating range, and provide digitally encoded representations of the recovered information data signal to the controller (e.g., the MC68HC05C4) 210, as discussed earlier. Consequently, the controller 210 may be capable of monitoring the recovered information data signal excursions about an operating region of the demodulator (i.e., the detector) 320. Memory module(s) (e.g., read only memory, random access memory, and non-volatile memory) 324 may provide storage for executable controller instructions, storage for intermediate sampling and comparison results, and storage for non-volatile configuration information that may be necessary to perform the decisions and actions in the inventive control process, as will be subsequently more fully discussed.

Figure 4A:
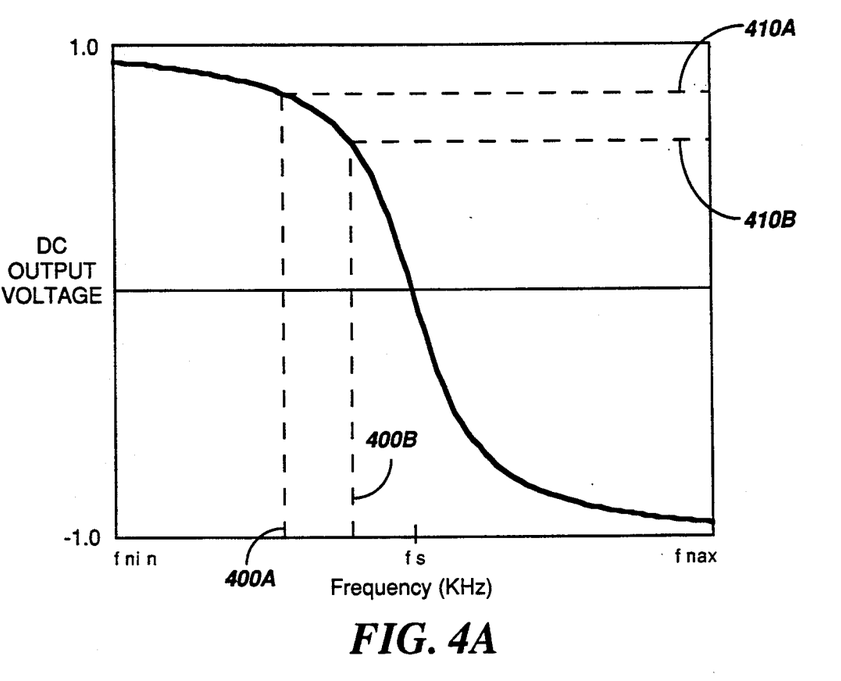
FIGS. 4A is a demodulator (i.e., detector) performance "S" curve illustrating a modulated carrier signal that is substantially misaligned with a control "mixing" signal.
Figure 4B:
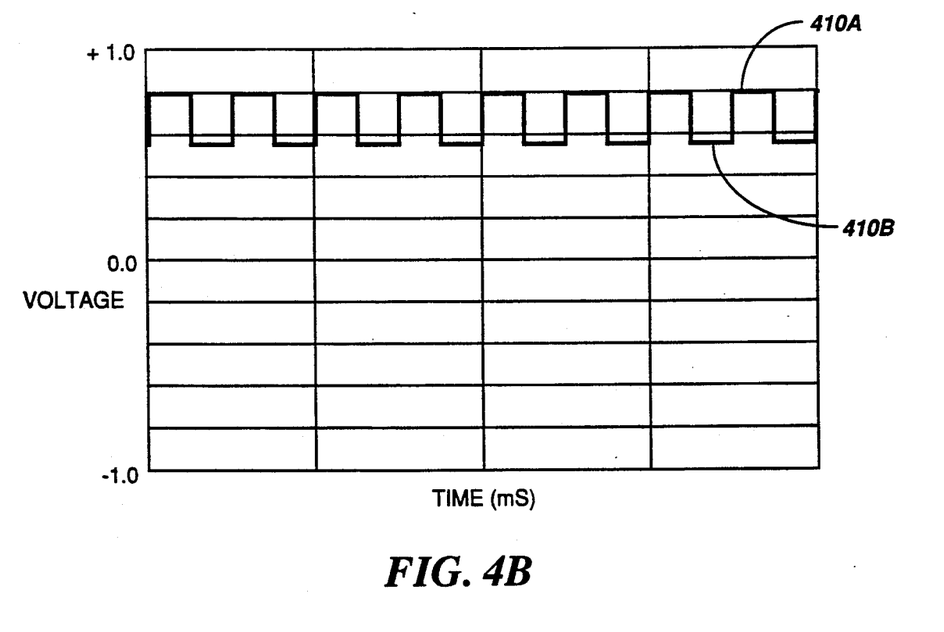
FIG. 4B is a recovered information data signal that may result from the demodulation of FIG. 4A.

Referring to FIGS. 4A and 4B, a demodulator operating range (i.e., a performance "S" curve) may comprise a linear operating region bounded by two substantially non-linear operating regions. Further, at least two spectral positions (400A and 400B) of a second intermediate frequency signal (i.e., a modulated carrier signal after preconditioning and converting) may be substantially misaligned with the linear operating region of the demodulator 320. Consequently, a recovered information data signal may result having at least two states (410A and 410B), as shown. This unfortunate condition may be substantially attributed to a misalignment of the converting process (306). That is, the received signal (i.e., the received modulated carrier) may be substantially misaligned with the control "mixing" signal frequency at the first mixer 306. Hence, the converted intermediate frequency signal excursions may be substantially skewed with respect to an acceptable operating range for the demodulating circuits 320, and therefore the recovered information data signal may regrettably include less than optimum signal excursions (i.e., distortion).

Figure 5A:
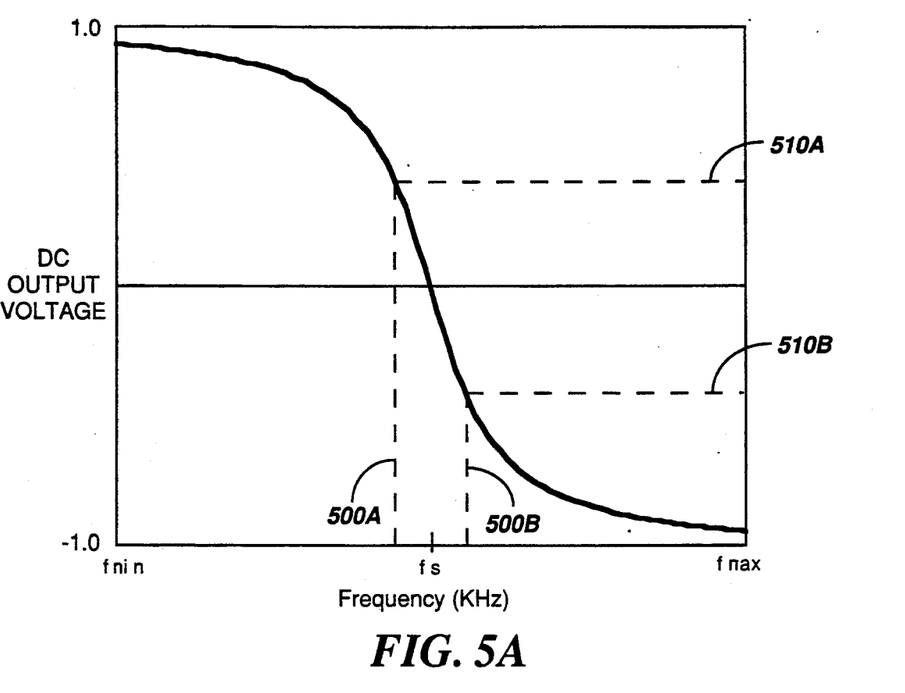
FIG. 5A is a demodulator performance "S" curve illustrating a modulated carrier signal that is substantially aligned with a control "mixing" signal.
Figure 5B:
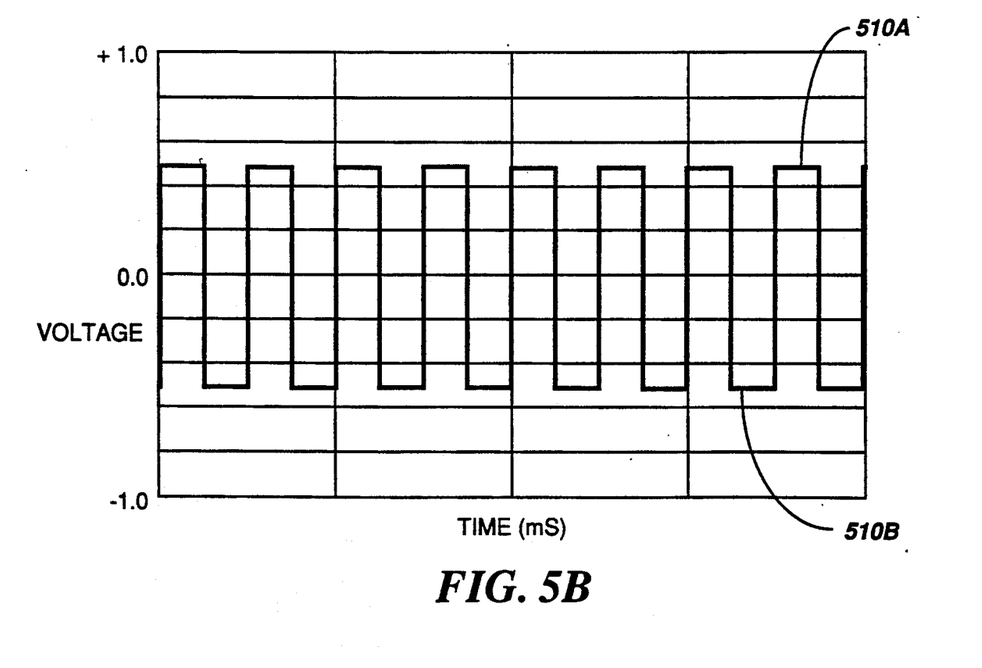
FIG. 5B is a recovered information data signal that may result from the demodulation of FIG. 5A.

Referring to FIGS. 5A and 5B, the demodulator operating range (i.e., the performance "S" curve) is shown again, this time having at least two spectral positions (500A and 500B) of a second intermediate frequency signal (i.e., a modulated carrier signal after preconditioning and converting) substantially aligned with the linear operating region of the demodulator 320. Consequently, a recovered information data signal may result having at least two states (510A and 510B), as shown. Hence, the received signal (i.e., the received modulated carrier) being substantially aligned with the control "mixing" signal frequency at the first mixer 306 may result in converted intermediate frequency signal excursions that are within the acceptable operating range of the demodulating circuits 320. Therefore, the recovered information data signal may include optimum signal excursions (i.e., minimum distortion due to misalignment).

As may be seen from comparison of FIGS. 4B to 5B, by monitoring recovered information signal excursions (e.g., recovered information data signal excursions) having at least two states (410A, 410B, 510A, and 510B), the controller 210 may be capable of adjusting the control "mixing" signal frequency in response to the recovered information data signal at least two states. Further, the controller 210 may adapt to the changing magnitude of the difference of the at least two states and maintain an optimum magnitude for the difference of the at least two states. In this way, the optimum recovered information data signal excursions may be maintained, having minimum distortion due to the aforementioned misalignment, as will be more fully discussed below.

In many communication systems, a transmitted signal may comprise a carrier signal superimposed with a predetermined modulation. For example, in a paging communication system a transmitted carrier signal may comprise a synchronizing comma signal of a known amplitude, frequency, and duration (e.g., a comma signal deviating from the carrier center frequency at approximately ±4 KiloHertz, having a 600 bits per second 50% duty cycle waveform, and possibly lasting for approximately 150 mS). Known communication protocols, such as Golay Sequential Coding (GSC) and Post Office Code Standardisation Advisory Group (POCSAG), have provisions for such synchronizing signals. The known signal simply may include at least two states that may be monitored by the controller 210, as discussed earlier.

By monitoring the at least two states of the known recovered information data signal, for example, the controller 210 is capable of adjusting the control "mixing" signal frequency, thereby substantially resynchronizing the control "mixing" signal frequency to the carrier signal frequency. Therefore, by maintaining an optimum magnitude for the difference of the at least two states of the known recovered information data signal, the demodulation (320) is maintained within an operating region (e.g., a linear operating region) of the demodulator (i.e., the recovering means) 320.

Figure 6:
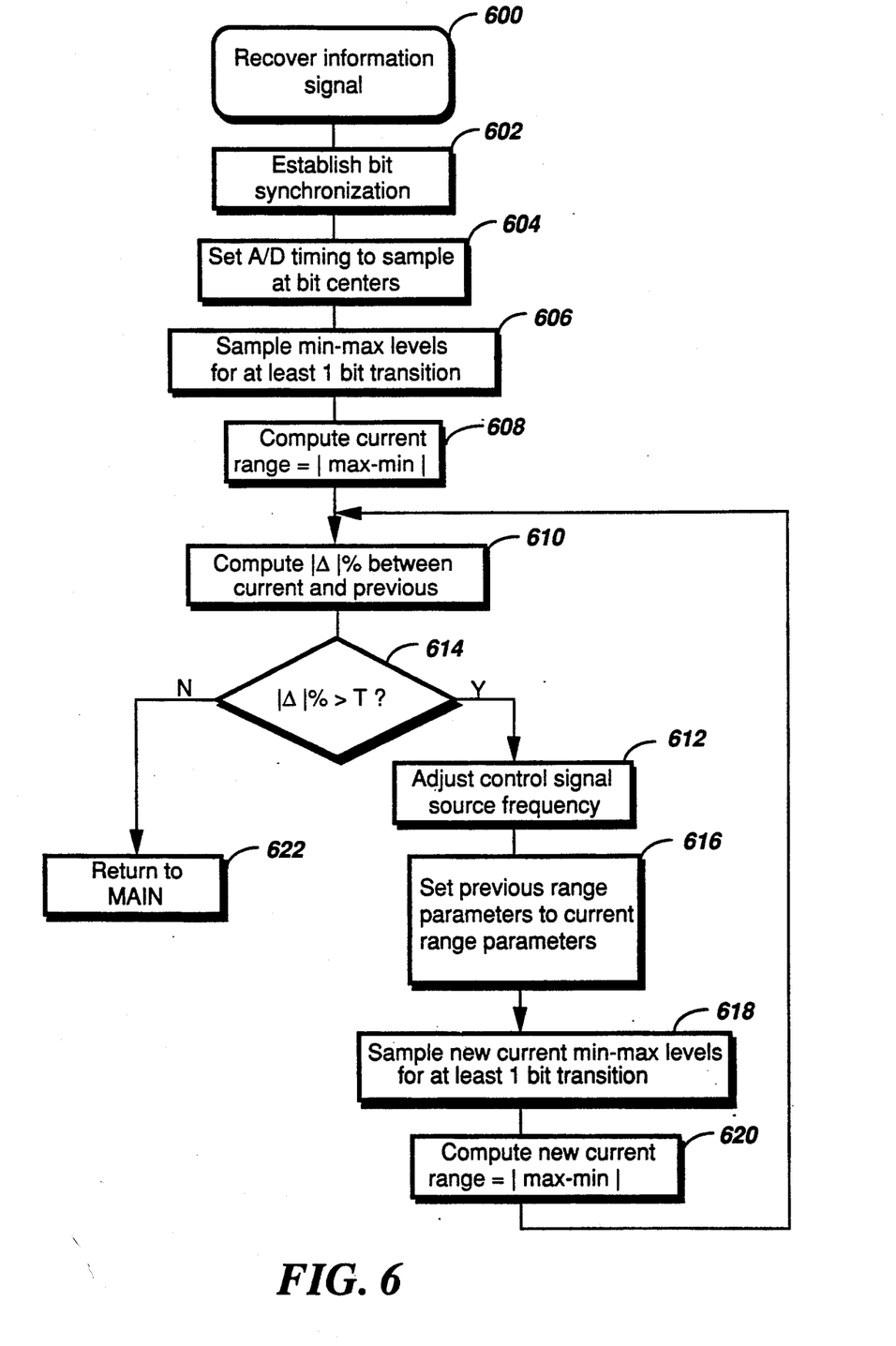
FIG. 6 is a flow diagram for a controller that adjusts a control "mixing" signal in response to at least two states of a recovered information data signal, in accordance with an embodiment of the present invention.

Referring to FIGS. 3 and 6, a flow diagram illustrates a control sequence for the controller 210 that adjusts a control "mixing" signal frequency in response to a comparison of at least two states of a recovered information signal (e.g., a recovered information data signal), in accordance with an embodiment of the present invention. The communication receiver (e.g., selective call receiver) 200 may periodically monitor the recovered information signal 600, and upon establishing a bit synchronization (e.g., synchronization to a comma signal, as discussed earlier) 602 begin to sample, preferably at the center of each bit 604, the relative minimum and maximum levels during at least one bit transition (i.e., at least two states of the recovered information signal) 606. And consequently compute the magnitude of the difference between the at least two sampled states of the recovered information signal 608. This magnitude value may be representative of the dynamic range of the recovered information signal.

By comparing the current range magnitude sampled with respect to a stored previous value and associated parameters 610, the controller 210 may adjust the control "mixing" signal frequency accordingly 612. However, the percent difference between the current and previous magnitudes may be required to exceed a minimum value "T" 614. The minimum percent difference requirement (i.e., greater than a value T) (614) before a frequency adjustment may be performed (612) may serve to limit the number of frequency adjustments performed as the current and previous sampled dynamic ranges tend to converge within acceptable accuracy (e.g., within a 10% of each other).

Therefore, when the control "mixing" signal frequency adjustment is performed (612) the current dynamic range magnitude and associated parameters are stored into memory 324. Thus, the current sampled range information is designated a previous range magnitude and parameters 616. Subsequently, a new current range magnitude may be sampled 618 and computed 620, leading to a new comparison of the new current range value and the previous range value (i.e., stored into memory 324). The control "mixing" signal frequency adjustments may therefore be repeated until a convergence (i.e., within acceptable accuracy) is detected. When the current sample range magnitude and the previous range magnitude are within acceptable limits 614, control may return to perform other tasks, if necessary 622.

Therefore, in the inventive control sequence the controller 210 is capable of monitoring the at least two states of the recovered information signal and adaptively control the controllable frequency synthesizer 208 to maintain the at least two states of the recovered information signal within an acceptable operating region of the demodulator.

I claim:

1. A communication receiver, comprising:
   means for converting a received signal to a first signal;
   means for recovering an information signal from the first signal, the information signal having at least two amplitude states corresponding with at least two spectral positions of the first signal, respectively; and
   means coupled to the converting means and the recovering means for adjusting a frequency of at least one control signal provided to the converting means to maintain the at least two spectral positions of the first signal within an operating region of the recovering means by maximizing an amplitude differential between the at least two information signal amplitude states corresponding to the at least two spectral positions of the first signal within the operating region of the recovering means.

2. The communication receiver of claim 1, wherein the adjusting means further comprises analog-to-digital conversion means for monitoring the recovered at least two information signal amplitude states.

3. The communication receiver of claim 1, wherein the adjusting means comprises a controllable signal source capable of providing the at least one control signal to the converting means.

4. The communication receiver of claim 3, wherein the controllable signal source comprises a controllable frequency synthesizer including a programmable phase-locked loop capable of stepping the frequency of the at least one control signal in coarse or very fine increments.

5. The communication receiver of claim 1, wherein the operating region of the recovering means includes a substantially linear operating region for recovering the at least two information signal amplitude states corresponding to the at least two spectral positions of the first signal.

6. The communication receiver of claim 1, wherein the operating region of the recovering means includes a substantially nonlinear operating region for recovering the at least two information signal amplitude states corresponding to the at least two spectral positions of the first signal.

7. The communication receiver of claim 1, wherein the recovering means comprises means for recovering an information data signal from the first signal.

8. The communication receiver of claim 1, further comprising an antenna coupled to the converting means for receiving a transmitted signal comprising at least two level frequency shift keying modulation.

9. The communication receiver of claim 1, wherein the converting means comprises means for mixing the received signal with the at least one control signal to provide the first signal.

10. The communication receiver of claim 9, wherein the adjusting means comprises a controllable signal source capable of providing the at least one control signal to the mixing means for adjusting the frequency of the at least one control signal provided to the mixing means to maintain the at least two spectral positions of the first signal within an operating region of the recovering means by maximizing an amplitude differential between the at least two information signal amplitude states corresponding to the at least two spectral positions of the first signal within the operating region of the recovering means.

11. The communication receiver of claim 1, further comprising memory means coupled to the adjusting means for storing at least one control configuration for use by the adjusting means to adjust the frequency of the at least one control signal provided to the converting means.

12. In a communication receiver, a method comprising the steps of:
   (a) converting a received signal to a first signal;
   (b) recalling at least one control configuration for use in converting the received signal to the first signal;
   (c) applying the recalled at least one control configuration in converting the received signal to the first signal;
   (d) storing at least one control configuration for use in converting the received signal to the first signal;
   (e) recovering from the first signal an information signal having at least two amplitude states corresponding with at least two spectral positions of the first signal, respectively;
   (f) monitoring an amplitude differential between the recovered at least two information signal amplitude states; and
   (g) adjusting a frequency of at least one control signal provided for converting the received signal to the first signal to maintain the at least two spectral positions of the first signal within an operating region of the recovering means by maximizing an amplitude differential between the at least two information signal amplitude states corresponding to the at least two spectral positions of the first signal within the operating region of the recovering means.

13. The method of claim 12, wherein step (e) comprises recovering an information data signal from the first signal.

14. A selective call receiver, comprising:
   an antenna for receiving a transmitted signal comprising at least two level frequency shift keying modulation;
   means coupled to the antenna for mixing the received signal with at least one control signal to convert down the received signal to provide a first signal;
   means for recovering a data information signal from the first signal, the recovered data information signal having at least two amplitude states corresponding with at least two spectral positions of the first signal, respectively;

a controllable frequency synthesizer coupled to the mixing means and capable of providing the at least one control signal thereto, the controllable frequency synthesizer is also capable of being controlled for adjusting the frequency of the at least one control signal provided therefrom;

memory means for storing at least one control configuration for controlling the controllable frequency synthesizer;

analog-to-digital monitoring means coupled to the recovering means for monitoring an amplitude differential between the at least two recovered data information signal amplitude states; and means coupled to the memory means, the analog-to-digital monitoring means, and the controllable frequency synthesizer for controlling the controllable frequency synthesizer for adjusting the frequency of the at least one control signal provided to the mixing means to maintain the at least two spectral positions of the first signal within an operating region of the recovering means by maximizing an amplitude differential between the at least two recovered data information signal amplitude states corresponding to the at least two spectral positions of the first signal within the operating region of the recovering means.

* * * * *